(12) United States Patent
Kadota et al.

(10) Patent No.: US 8,261,418 B2
(45) Date of Patent: Sep. 11, 2012

(54) METHOD FOR MANUFACTURING SURFACE ACOUSTIC WAVE DEVICE

(75) Inventors: Michio Kadota, Kyoto-fu (JP); Tetsuya Kimura, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 434 days.

(21) Appl. No.: 12/607,246

(22) Filed: Oct. 28, 2009

(65) Prior Publication Data

US 2010/0043191 A1    Feb. 25, 2010

Related U.S. Application Data

(60) Division of application No. 12/167,344, filed on Jul. 3, 2008, now Pat. No. 7,629,866, which is a continuation of application No. PCT/JP2006/324752, filed on Dec. 12, 2006.

(30) Foreign Application Priority Data

Jan. 11, 2006 (JP) ................................. 2006-003488

(51) Int. Cl.
*H01L 41/53* (2006.01)
*H04R 17/10* (2006.01)

(52) U.S. Cl. ........ 29/25.35; 29/847; 29/852; 310/313 A; 310/365

(58) Field of Classification Search .................. 29/25.35, 29/594, 847, 852; 310/313 R, 313 A, 365
See application file for complete search history.

(56) References Cited

U.S. PATENT DOCUMENTS

| 4,993,000 A | 2/1991 | Niitsuma et al. |
| 6,367,133 B2 * | 4/2002 | Ikada et al. ................. 29/25.35 |
| 7,888,841 B2 * | 2/2011 | Kadota et al. ............. 310/313 A |

FOREIGN PATENT DOCUMENTS

| JP | 56-064509 A | | 6/1981 |
| JP | 63-137096 A | | 6/1988 |
| JP | 06006160 A | * | 1/1994 |
| JP | 10335974 A | * | 12/1998 |
| JP | 2000-341066 A | | 12/2000 |
| JP | 2004-015563 A | | 1/2004 |

OTHER PUBLICATIONS

Kadota et al.; "Method for Manufacturing Surface Acoustic Wave Device and Surface Acoustic Wave Device"; U.S. Appl. No. 12/167,344, filed Jul. 3, 2008.
Official Communication issued in corresponding European Patent Application No. 06834507.3, mailed on May 3, 2010.
Tanski, "A Configuration and Circuit Analysis for One-Port Saw Resonators," Journal of Applied Physics, vol. 49, No. 4, Apr. 1978, pp. 2559-2560.
Official Communication issued in corresponding Chinese Patent Application No. 200680050852.5, mailed on May 12, 2010.
Official Communication issued in corresponding Japanese Patent Application No. 2007-553853, mailed on Sep. 21, 2010.

* cited by examiner

*Primary Examiner* — A. Dexter Tugbang
(74) *Attorney, Agent, or Firm* — Keating & Bennett, LLP

(57) ABSTRACT

A method for manufacturing a surface acoustic wave filter device includes a step of forming grooves in one principal surface of a piezoelectric substrate, a step of embedding a metallic film in the grooves to form IDT electrodes, a step of performing a process of removing a portion of the piezoelectric substrate from the one principal surface of the piezoelectric substrate, thereby forming a recessed portion including the bottom surface in which the IDT electrodes are embedded, and a step of bonding a cover member to the piezoelectric substrate.

8 Claims, 6 Drawing Sheets

METHOD FOR MANUFACTURING SURFACE ACOUSTIC WAVE DEVICE

BACKGROUND OF THE INVENTION

1. Field of the Invention

The present invention relates to a method for manufacturing a surface acoustic wave device that is preferably used as a surface acoustic wave resonator or a surface acoustic wave filter which utilizes a surface acoustic wave, such as Rayleigh wave, Love wave, or Leaky wave, and a surface acoustic wave device. More particularly, the present invention relates to a method, in which a step of forming an air gap in a portion in which a surface acoustic wave is excited is improved, a method for manufacturing a surface acoustic wave device, and a surface acoustic wave device.

2. Description of the Related Art

In the related art, the miniaturization of mobile communication equipment, such as mobile phones, has been in high demand. For this reason, the miniaturization of band-pass filters used in this type of communication equipment has been in high demand.

As compact band-pass filters, in the related art, surface acoustic wave filters that utilize surface acoustic waves have been commonly used. In Japanese Unexamined Patent Application Publication No. 7-115343, a surface acoustic wave filter device capable of being miniaturized is disclosed.

Figure 7:
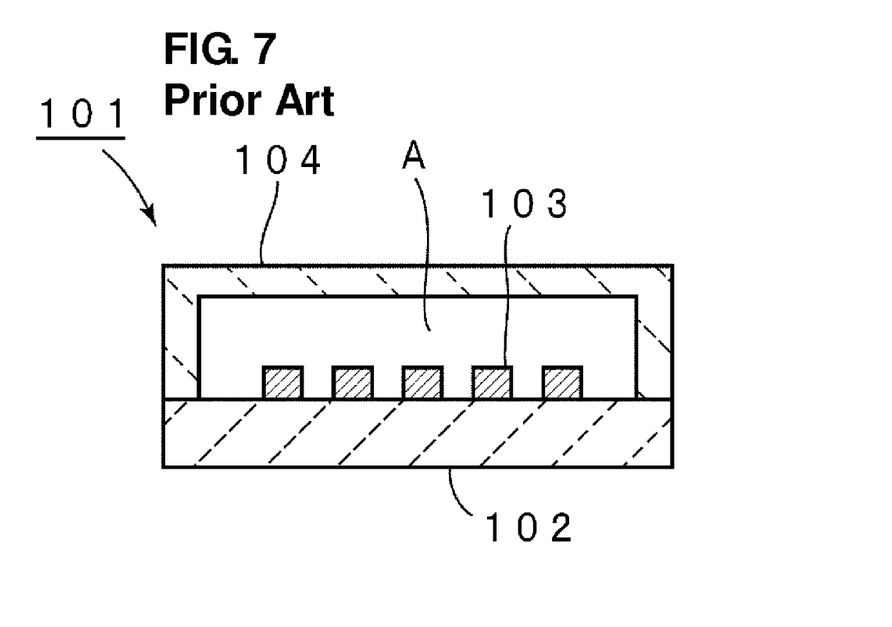
FIG. 7 is a front sectional view of a surface acoustic wave filter device in the related art, describing an example of the surface acoustic wave filter device.

As shown in FIG. 7, in a method for manufacturing a surface acoustic wave device 101 that is disclosed in Japanese Unexamined Patent Application Publication No. 7-115343, first, a piezoelectric substrate 102 is prepared. On the top surface of the piezoelectric substrate 102, electrodes, such as IDT electrodes 103, are arranged to define a surface acoustic wave filter. The IDT electrodes 103 are provided in a portion of the piezoelectric substrate. The portion of the piezoelectric substrate is excited when the surface acoustic wave filter is used, and a surface acoustic wave is propagated. Accordingly, it is necessary to form an air gap A that the IDT electrodes 103 face. For this reason, as shown in FIG. 7, a cover member 104 is bonded to the piezoelectric substrate 102 so that the cover member 104 covers the top surface of the piezoelectric substrate 102 and so that the air gap A is maintained.

In the manufacturing method disclosed in Japanese Unexamined Patent Application Publication No. 7-115343, the bonding of the cover member 104 is performed by direct bonding without using an adhesive. Direct bonding is a method in which heat is applied to the piezoelectric substrate 102 and the cover member 104 with the piezoelectric substrate 102 being in contact with the cover member 104 to make hydrogen bonds therebetween, thereby directly bonding the piezoelectric substrate 102 and the cover member 104 together. Accordingly, the surfaces of portions facing the surfaces of the piezoelectric substrate 102 and the cover member 104 which are to be bonded must include hydrophilic groups. The hydrophilic groups are to be bonded by hydrogen bonds of water molecules provided from moisture.

Because the bonding is performed by direct bonding, no adhesive is required. A sealing property of portions of the cover member 104 and the piezoelectric substrate 102 to be bonded can be increased.

Because, in the surface acoustic wave filter device 101 disclosed in Japanese Unexamined Patent Application Publication No. 7-115343, it is necessary to form the air gap A, the size of the entire package is increased.

Additionally, a recessed portion used to form the air gap A must be provided in the cover member 104, or the cover member 104 having a recessed portion must be provided. Accordingly, there is also a problem that the cost is high.

SUMMARY OF THE INVENTION

To overcome the problems described above, preferred embodiments of the present invention provide a surface acoustic wave device which does not require a complicated processing step, which does not require preparation of a component, such as a cover member having a complicated shape, which is inexpensive, and which is capable of having a reduced size, and a method for manufacturing the surface acoustic wave device.

A method for manufacturing a surface acoustic wave device according to a preferred embodiment of the present invention includes the steps of preparing a piezoelectric substrate and a cover member, forming, in one principal surface of the piezoelectric substrate, grooves in portions in which an IDT electrode and a wiring electrode are to be provided, forming, on the one principal surface of the piezoelectric substrate, a metallic film at least in the grooves, forming a recessed portion by removing one portion of the piezoelectric substrate from the principal surface side of the piezoelectric substrate to form, using the metallic film located in the grooves, the IDT electrode and the wiring electrode, and bonding the cover member to the one principal surface of the piezoelectric substrate.

The step of forming the recessed portion is preferably performing using a chemical mechanical polishing (CMP) process from the one principal surface side of the piezoelectric substrate.

The step of forming the recessed portion is preferably performed by dry etching while a mask is applied to the one principal surface of the piezoelectric substrate.

The step of bonding the cover member to the piezoelectric substrate is preferably performed by direct bonding.

When the piezoelectric substrate and the cover member are to be directly bonded together, a hydrophilic insulating thin film is preferably formed on the one principal surface of the piezoelectric substrate or on a surface of the cover member that is to be bonded to the piezoelectric substrate.

The method described above preferably further includes a step of forming, in the piezoelectric substrate, a through-hole electrode that is to be connected to the wiring electrode.

The method described above preferably further includes a step of forming, in the cover member, a through-hole electrode that is to be electrically connected to the wiring electrode.

In another preferred embodiment of the method for manufacturing a surface acoustic wave device according to the present invention, a piezoelectric substrate is provided as the cover member and includes an IDT electrode and a wiring electrode formed in one principal surface thereof.

A surface acoustic wave device according to a preferred embodiment of the present invention includes a piezoelectric substrate having a recesssed portion provided in one principal surface thereof, a groove having a planar shape corresponding to a shape of an IDT electrode is provided in the recessed portion, an IDT electrode embedded in the groove, a cover member bonded to the one principal surface of the piezoelectric substrate, a through-hole electrode that is provided in the piezoelectric substrate and/or the cover member, and that is electrically connected to the IDT electrode, and a terminal electrode that is provided in the piezoelectric substrate and/or the cover member, that is electrically connected to the through-hole electrode, and that is disposed so as to be electrically connected to an external device.

A groove having a planar shape corresponding to a shape of a wiring electrode is preferably provided in the one principal surface of the piezoelectric substrate at a location that is different from that of the recessed portion, and the wiring electrode is embedded in the groove.

In the method for manufacturing a surface acoustic wave device according to a preferred embodiment of the present invention, the grooves are formed in the one principal surface of the piezoelectric substrate. Thereafter, the metallic film is formed at least in the grooves, and one portion of the piezoelectric substrate is removed from the principal surface side of the piezoelectric substrate to form the recessed portion. By forming the recessed portion, the IDT electrode and the wiring electrode are formed of the metallic film located in the grooves. Even when the metallic film extends to the periphery of the grooves, when the recessed portion is formed, the recessed portion is formed so as to remove a portion of the metallic film that is located at the periphery of the grooves. Accordingly, in the one principal surface of the piezoelectric substrate, the IDT electrode is formed at a location lower than that of the one principal surface. Thus, for example, even when a cover member having a planar shape is used, by bonding the cover member to the one principal surface, an air gap that the IDT electrode faces can be formed using the recessed portion. Therefore, no cover member having a complicated shape is required. Additionally, no complicated step of forming an air gap in the cover member is required.

When the recessed portion is formed, the size of the air gap can be precisely and easily adjusted, and the air gap can be formed by forming the recessed portion. Accordingly, the size of the surface acoustic wave device can be reduced. Thus, the cost and the size of the surface acoustic wave device can be reduced.

When the recessed portion is formed by performing a CMP process from the one principal surface side of the piezoelectric substrate, the recessed portion can be precisely and easily formed without degradation of the piezoelectric substrate.

When the recessed portion is formed by dry etching while a mask is applied, the recessed portion can be easily formed only by preparing a mask having a shape corresponding to a planar shape of the recessed portion and by performing the dry etching.

When the step of bonding the cover member is performed by direct bonding, no adhesive is required. Accordingly, the cost can be reduced. Additionally, when the cover member is bonded to the piezoelectric substrate by the direct bonding, a low profile is further enhanced. Furthermore, the surface acoustic wave device can be provided, in which variations in the bonded portion is reduced, in which variations in characteristics are reduced, and which has an outstanding reliability.

When the piezoelectric substrate and the cover member are directly bonded together, a hydrophilic insulating thin film may be formed on the one principal surface of the piezoelectric substrate and/or the surface of the cover member that is to be bonded to the piezoelectric substrate. With this configuration, even when the piezoelectric substrate or the cover member does not include hydrophilic groups on the surface thereof, by forming the hydrophilic insulating thin film, the piezoelectric substrate and the cover member can securely bonded together by the direct bonding.

When the method further includes the step of forming, in the piezoelectric substrate, a through-hole electrode that is to be connected to the wiring electrode, the wiring electrode can be, for example, connected to an external device via the through-hole electrode. Similarly, when the method further includes the step of forming, in the cover member, a through-hole electrode that is to be electrically connected to the wiring electrode, the wiring electrode can be easily electrically connected to, for example, an external device via the through-hole electrode.

When the cover member is defined by a piezoelectric substrate including an IDT electrode and a wiring electrode, a surface acoustic wave device in which two surface acoustic wave elements are stacked can be provided in accordance with preferred embodiments of the present invention. Accordingly, electronic equipment or a circuit in which the surface acoustic wave device is mounted can be reduced in size and designed with a high density.

In the surface acoustic wave device according to preferred embodiments of the present invention, the recessed portion is formed in the one principal surface of the piezoelectric substrate. The groove having a planer shape corresponding to a shape of a portion of an IDT electrode is formed in the recessed portion, and the IDT electrode is formed so as to be embedded in the groove. Accordingly, the cover member is bonded to the one principal surface of the piezoelectric substrate, and an air gap can be formed which does not prevent the IDT electrode from vibrating in the recessed portion. Thus, the size of the surface acoustic wave device can be reduced. Furthermore, because the air gap is formed using the recessed portion, a cover member having a planar shape can be used, thereby reducing the cost of the cover member.

The through-hole electrode may be provided in the piezoelectric substrate and/or the cover member, and the terminal electrode that is electrically connected to the through-hole electrode and that is disposed so as to be electrically connected to an external device may be provided. In such a configuration, the IDT electrode can be easily electrically connected to the external device via the through-hole electrode and the terminal electrode.

Accordingly, the surface acoustic wave device can be obtained, which is miniaturized, inexpensive, and arranged to be easily mounted on a printed circuit board.

The groove having a planar shape corresponding to a shape of a wiring electrode may be formed in the one principal surface of the piezoelectric substrate at a location different from that of the recessed portion, and the wiring electrode may be embedded in the groove. In such a configuration, the wiring electrode can be formed by the same step as that of forming the IDT electrode. As a result, the size and cost of the surface acoustic wave device can be reduced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings, whereby the present invention will become apparent.

Figure 1A:
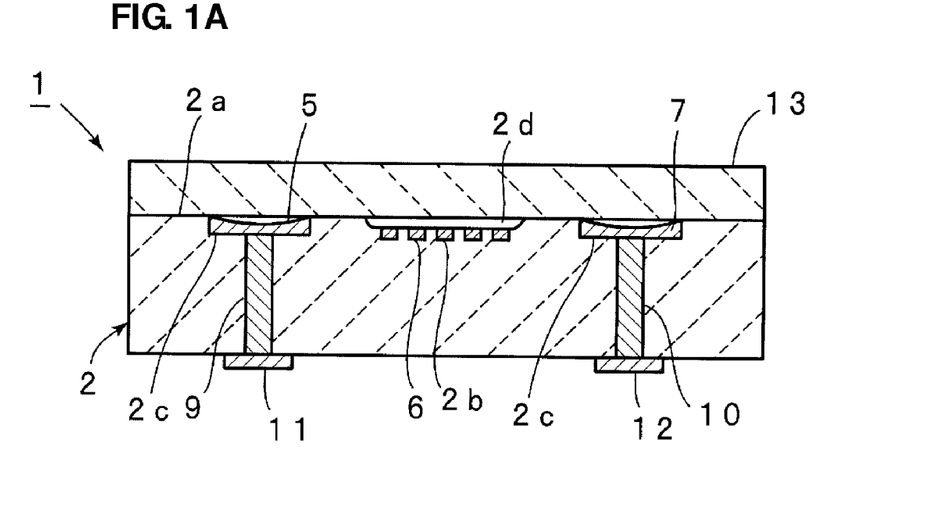
FIGS. 1A and 1B are a front sectional view of a surface acoustic wave filter device according to a preferred embodiment of the present invention and a partial enlarged front sectional view of the surface acoustic wave filter device, illustrating the main portion of the surface acoustic wave filter device.
Figure 1B:
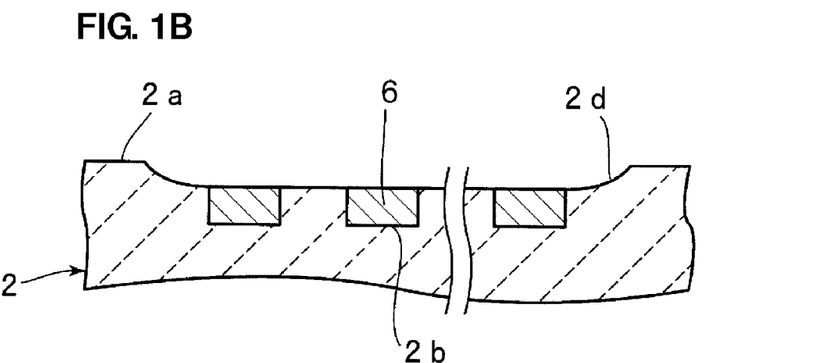

FIGS. 1A and 1B are a front sectional view of a surface acoustic wave filter device according to a preferred embodiment of the present invention and a partial enlarged front sectional view of the surface acoustic wave filter device, showing the enlarged main portion of the surface acoustic wave filter device. A method for manufacturing a surface acoustic wave filter device 1 according to the preferred embodiment will be described with reference to FIG. 2A to 2E and FIGS. 3A to 3D.

Figure 2A:
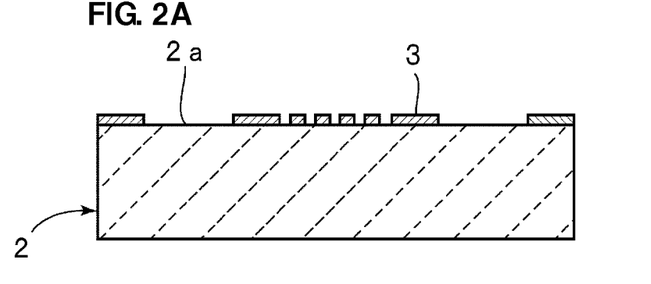
FIGS. 2A to 2E are schematic front sectional views of the surface acoustic wave filter device according to a preferred embodiment of the present invention, illustrating a method for manufacturing the surface acoustic wave filter device.

First, FIG. 2A, a piezoelectric substrate 2 is prepared. The piezoelectric substrate 2 may be made of a piezoelectric single crystal or a piezoelectric ceramic. In this preferred embodiment, the piezoelectric substrate 2 is made of crystal. On a top surface 2a defining one principal plane of the piezoelectric substrate 2, a mask 3 is formed using a photolithography method. The resist mask 3 includes openings defining portions in which IDT electrodes and wiring electrodes are to be formed. Instead of using the resist mask 3, a metallic mask made of Ni, Cr, or other suitable materials may be used.

Figure 2B:
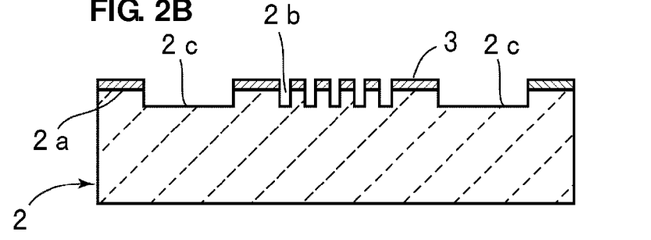

Next, as shown in FIG. 2B, portions of the piezoelectric substrate facing the openings of the resist mask 3 are removed using an etching method to form grooves 2b, 2c, and 2c. The grooves 2b have a planar shape corresponding to a planar shape in which the IDT electrodes are to be formed. The grooves 2c and 2c are provided in portions in which the wiring electrodes are to be formed.

When the etching is performed, an appropriate etchant that does not dissolve the resist mask 3 may be used. When the piezoelectric substrate 2 is formed of crystal, a fluoride gas, such as $CF_4$ or $SF_6$, or a chloride gas, such as $BCl_3$, may be used as the etchant. When the piezoelectric substrate 2 is formed of $LiTaO_3$ or $LiNbO_3$, a fluoride gas, Ar, or other suitable etchant may be used.

Figure 2C:
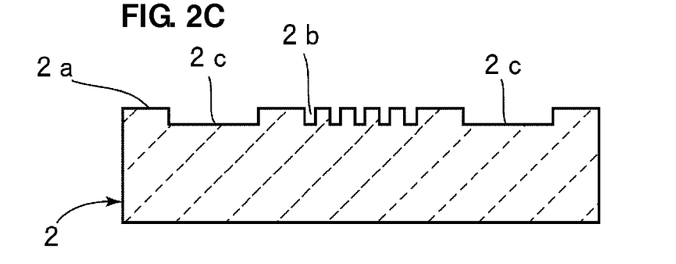

Next, the resist mask 3 is dissolved and removed using a resist removal liquid. In this manner, as shown in FIG. 2C, the piezoelectric substrate 2 in the top surface 2a of which the grooves 2b, 2c, and 2c are formed is prepared.

Figure 2D:
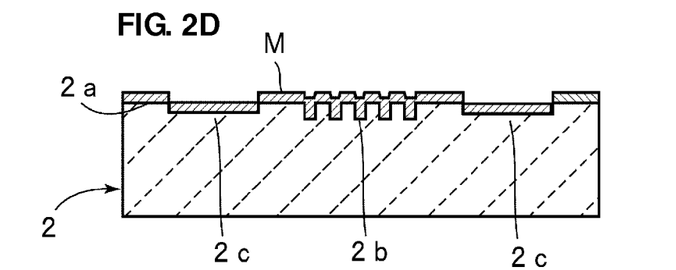

Then, as shown in FIG. 2D, a metallic film M is formed on the entire top surface 2a of the piezoelectric substrate 2 using an appropriate thin-film forming method, such as vapor deposition, sputtering, or plating, for example. Because the metallic film M functions as an electrode constituent material, the metallic film M can be formed of an appropriate metallic material. For example, the metallic film M may be formed of Al, Cu, Au, Ta, or W, an alloy of Al, Cu, Au, Ta, or W, or stacked metallic films formed of two or more types of metals chosen from among Al, Cu, Au, Ta, and W, for example.

Figure 2E:
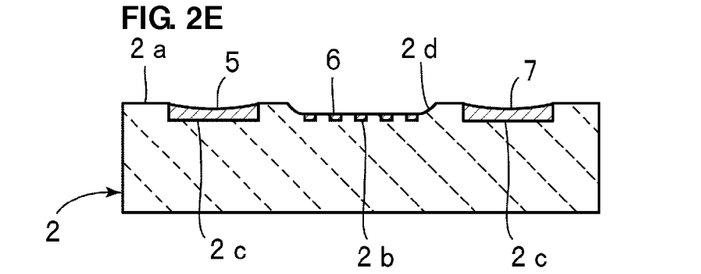

After that, as shown in FIG. 2E, using a CMP process, a portion of the top surface 2a of the piezoelectric substrate is removed from the top surface 2a side of the piezoelectric substrate 2 to form a recessed portion 2d. The recessed portion 2d is formed so that the above-described grooves 2b are located in the recessed portion 2d, i.e., so that a region in which the IDT electrodes are to be formed is located in the recessed portion 2d. When the CMP process is performed, the recessed portion 2d is formed, and a portion of the metallic film that is located at the periphery of a portion in which the IDT electrodes 6 are formed is removed. Additionally, wiring electrodes 5 and 7 are made of the metallic film that remains in the recessed portions 2c and 2c. A process of removing the portion of the top surface 2a of the piezoelectric substrate 2 by the CMP process is performed so that the metallic film excluding the portions in which the IDT electrodes 6 and the wiring electrodes 5 and 7 are formed can be removed. Accordingly, the IDT electrodes 6 are embedded in the grooves 2b. Similarly, the wiring electrodes 5 and 7 are embedded in the grooves 2c and 2c, respectively.

The CMP process is commonly used as a polishing method used in, for example, a method in which an interlayer-insulating film of a semiconductor device is formed. In the CMP process, when polishing is performed by a polishing head, a polishing liquid is supplied. The CMP process is a process in which mechanical polishing performed by the polishing head and chemical polishing using the polishing liquid are performed together.

The parameters of the CMP process can be appropriately set in accordance with the piezoelectric substrate 2 to be used, the depth and size of the recessed portion 2d to be formed are not particularly limited. However, in this preferred embodiment, for example, the CMP process may be performed by applying a polishing pressure of approximately 100 g/cm$^2$ using a polishing pad, which is configured using IC1000 manufactured by Nitta Haas, rotating at several tens rpm to several hundred rpm, and simultaneously by supplying a polishing liquid, for example. The polishing liquid, for example, is obtained by diluting one part of Planerlite 7102, which is manufactured by Fujimi Incorporated, with five parts of pure water.

When the above-described CMP process is performed, the recessed portion 2d is formed by erosion. The internal surface of the recessed portion 2d is formed as a curved surface around the edges of the recessed portion 2d. Additionally, the surface of the metallic film filling the grooves 2c is curved due to an effect of dishing as shown in FIG. 2E. In other words, since the central portions are polished more than the edge portions, the top surfaces of the wiring electrodes 5 and 7 are curved.

Figure 3A:
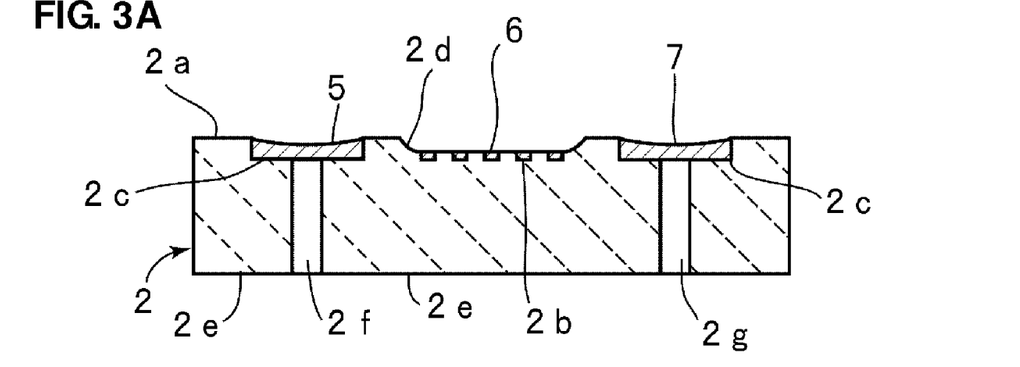
FIG. 3A to 3D are schematic front sectional views of the surface acoustic wave filter device according to a preferred embodiment of the present invention, illustrating the method for manufacturing the surface acoustic wave filter device.

Next, as shown in FIG. 3A, through holes 2f and 2g are formed, which are used to form through-hole electrodes so that the through-hole electrodes can extend to the wiring electrodes 5 and 7 formed in the top surface 2a from a bottom surface 2e of the piezoelectric substrate 2. The process of forming the through holes 2f and 2g is not particularly limited. However, the through holes 2f and 2g can be formed using an appropriate processing method in which a laser or sandblasting is used, for example. For example, a mask is formed on the bottom surface 2e of the piezoelectric substrate 2, and the mask has openings defining portions in which the through holes 2f and 2g are to be formed. By performing a sandblasting process, the through holes 2f and 2g can be formed.

Figure 3B:
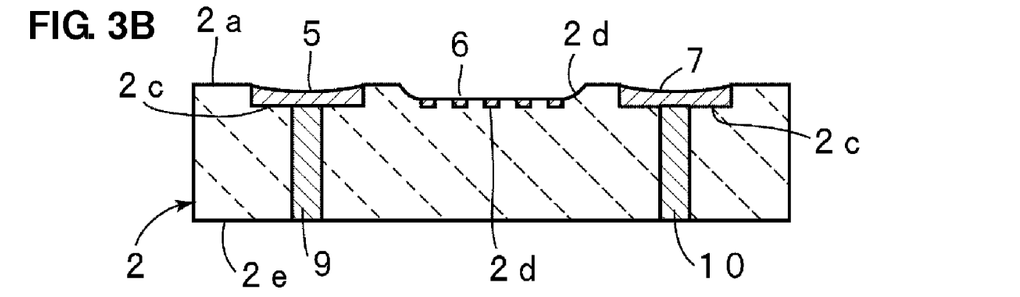

Then, as shown in FIG. 3B, the through holes 2f and 2g are filled with a metallic material, for example, by plating, thereby forming through-hole electrodes 9 and 10.

Figure 3C:
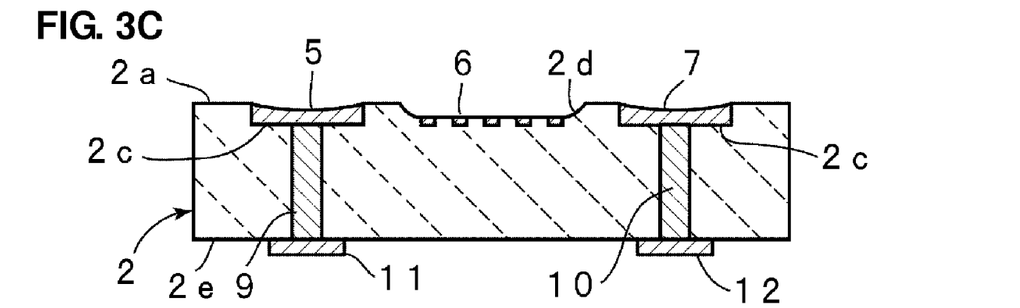

After that, as shown in FIG. 3C, terminal electrodes 11 and 12 are formed on the bottom surface 2e of the piezoelectric substrate 2 so that the terminal electrodes 11 and 12 can be electrically connected to the through-hole electrodes 9 and 10, respectively. The terminal electrodes 11 and 12 can be formed using an appropriate method such as plating or printing of metal bumps, for example.

Figure 3D:
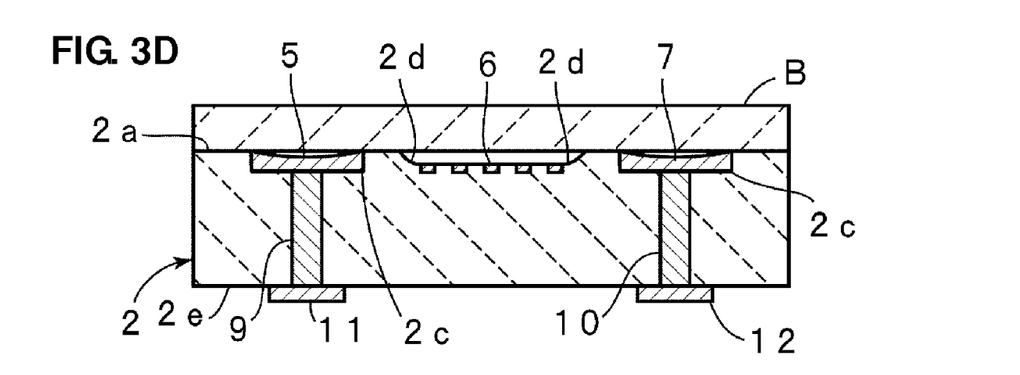

Then, as shown in FIG. 3D, a cover member 13 having a planar shape is bonded to the top surface of the piezoelectric substrate 2. In this case, for the cover member 13, an appropriate insulating material such as crystal, glass, or an Si-based material, for example, may be used. Preferably, the cover member 13 includes hydrophilic groups on the surface thereof.

After that, by direct bonding, the cover member 13 is bonded to the top surface 2a of the piezoelectric substrate 2. The direct bonding can be performed by, for example, application of heat at about 200° C. to about 400° C. for about one hour. As disclosed in Japanese Unexamined Patent Application Publication No. 7-115343, which is described above, the direct bonding is a method in which the cover member 13 and the piezoelectric substrate 2 are bonded together by hydrogen bonds without using an adhesive.

In other words, where hydrophilic groups exist on surfaces of the piezoelectric substrate 2 and the cover member 13 that are to be bonded, when heat is applied, water molecules provided from moisture in the atmosphere are bonded to the hydrophilic groups. Accordingly, the piezoelectric substrate 2 and the cover member 13 are bonded together by hydrogen bonds.

Before the direct bonding is performed, the surface of the piezoelectric substrate 2 may be immersed in a liquid mixture of ammonia and hydrogen peroxide in advance, thereby performing a process of making the surface hydrophilic.

When the surfaces of the cover member 13 and the piezoelectric substrate 2 do not include hydrophilic groups, preferably, a hydrophilic insulating thin film may be formed on the surface of the piezoelectric substrate 2 and/or the surface of the cover member 13 to be bonded.

By using the direct bonding method, in substantially the entire region of portions at which the cover member and the piezoelectric substrate 2 are in contact with each other and bonded together, the cover member 13 and the piezoelectric substrate 2 are strongly bonded together. Accordingly, the recessed portion 2d can be securely sealed in an airtight manner. The reliability of the surface acoustic wave device can also be increased, accordingly.

In the present preferred embodiment, when, to adjust the temperature characteristics or the frequency characteristics, a dielectric film of $SiO_2$, SiN, or other suitable material is provided on the IDT electrodes, the dielectric film may be arranged over substantially the entire surface of the piezoelectric substrate. After a process of making the dielectric film hydrophilic is appropriately performed, the direct bonding is performed.

In this manner, the surface acoustic wave filter device 1 shown in FIGS. 1A and 1B can be obtained.

As clearly shown in FIGS. 1A and 1B, in this present preferred embodiment, the recessed portion 2d is formed by the CMP process, thereby providing an air gap that the IDT electrodes 6 face. Accordingly, the cover member 13 having a planar shape, i.e., a cover member at least the bottom surface of which has a planar shape, can be used. A cover member having a complicated shape is not required. In addition, a complicated process is not required when forming the cover member. Thus, the cost of the surface acoustic wave filter device 1 can be reduced.

Additionally, by adjusting process conditions in which the CMP process is performed, the recessed portion 2d can be precisely and easily formed. Accordingly, the depth of the recessed portion 2d can also be reduced. Thus, the size of the surface acoustic wave filter device 1 can be minimized. More specifically, a low profile can be achieved.

Furthermore, the bonding is performed by the direct bonding, and no adhesive is used. Accordingly, characteristic deterioration caused by a variation in the bonded portion is not likely to occur. Accordingly, the low profile can be further improved.

In this preferred embodiment, the wiring electrodes are connected to the terminal electrodes via the through-hole electrodes. However, without providing the through-hole electrodes, the wiring electrodes may be electrically connected to the terminal electrodes via wiring patterns that are provided on the external surface of the piezoelectric substrate.

Furthermore, the through-hole electrodes may be provided on the cover member 13 side, instead of on the piezoelectric substrate side.

In this preferred embodiment, the recessed portion 2d is formed by the CMP process, whereby the air gap that the IDT electrodes face is formed. However, a dry etching method may be used when a recessed portion that faces IDT is formed. The IDT electrodes face the recessed portion. As a modified example, a method for forming the recessed portion using the dry etching method will be described with reference to FIG. 4A to 4C and FIGS. 5A to 5C.

Figure 4A:
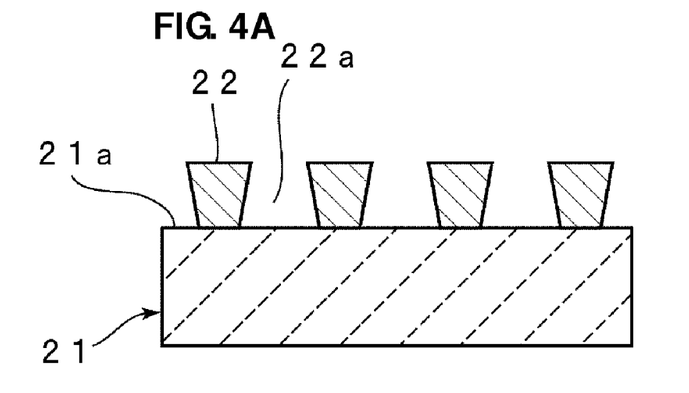
FIGS. 4A to 4C are schematic front sectional views of a recessed portion, describing a modification example in which the recessed portion is formed by dry etching.

In the modified example, as schematically shown in FIG. 4A, a mask 22 is formed on a top surface 21a of a piezoelectric substrate 21. The mask 22 includes openings 22a in which IDT electrodes and wiring electrodes (not shown) are to be formed.

Figure 4B:
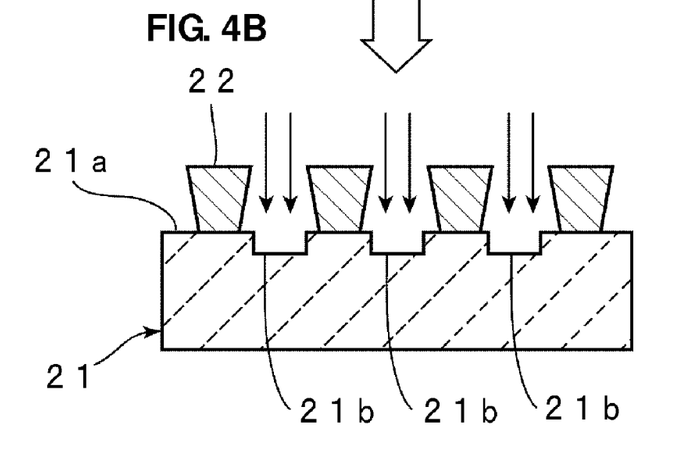

In other words, as shown in FIG. 4B, grooves 21b are formed in the top surface 21a defining one principal plane of the piezoelectric substrate 21 using the dry etching method. The grooves 21b have a planar shape corresponding to a planar shape of the IDT electrodes.

Figure 4C:
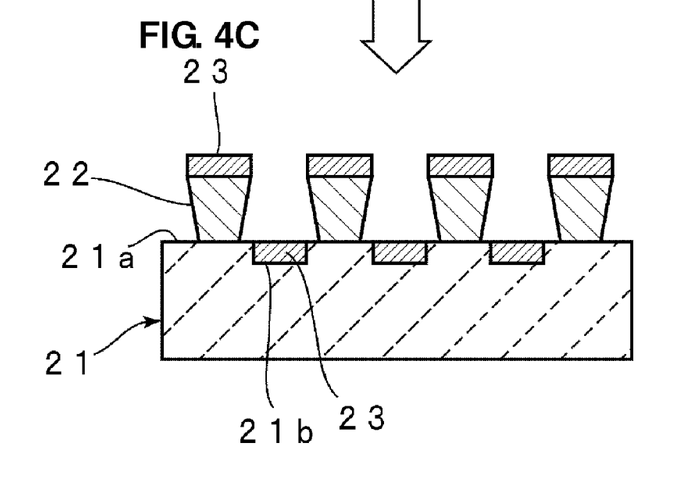

After that, as shown in FIG. 4C, a metallic film 23 forming the IDT electrodes is provided over the entire surface, thereby filling the grooves 21b with the metallic film to form the metallic film 23 defining the IDT electrodes.

Figure 5A:
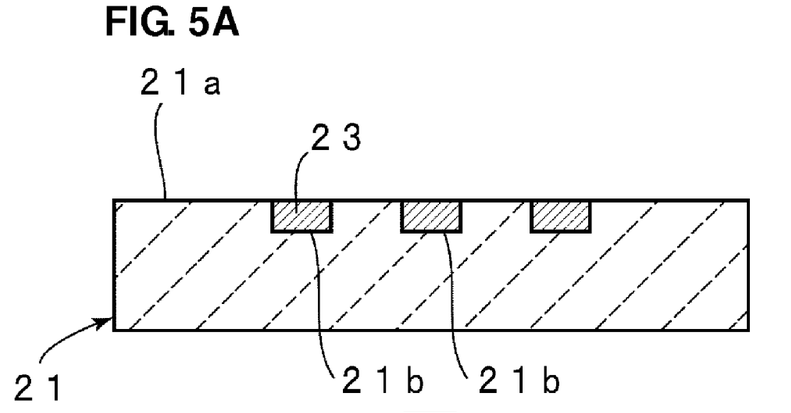
FIGS. 5A to 5C are schematic front sectional views of the recessed portion, describing the modification example in which the recessed portion is formed by dry etching.

Then, the mask 22 and the metallic film 23, which is stacked on the mask 22, are removed using a lift-off method using a solvent that removes the mask 22. In this manner, as shown in FIG. 5A, the piezoelectric substrate 21 is obtained, which includes the metallic film 23 defining the IDT electrodes that are embedded in the grooves 21b.

The mask 22 may be formed of a material similar to that of the resist mask 3 or the metallic film M in the forgoing preferred embodiment. Additionally, regarding the method for forming the grooves 21b by dry etching, the method can be performed by dry etching using an appropriate etchant in accordance with the material of the piezoelectric substrate 21.

Figure 5B:
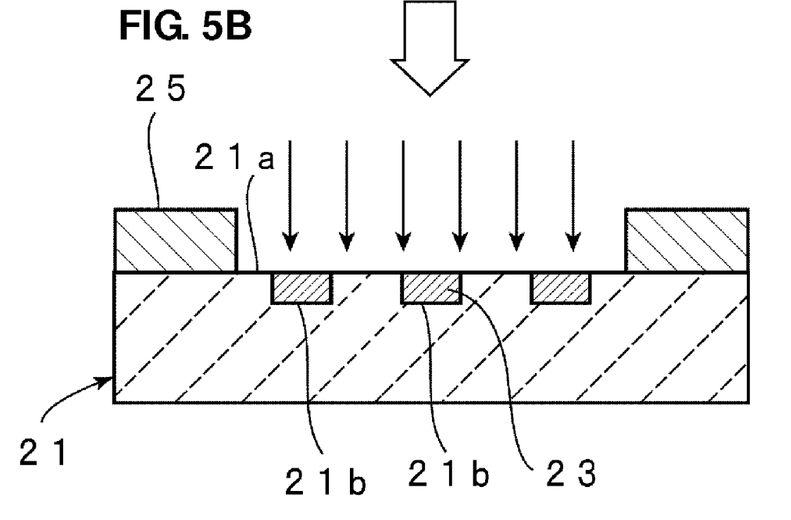
Figure 5C:
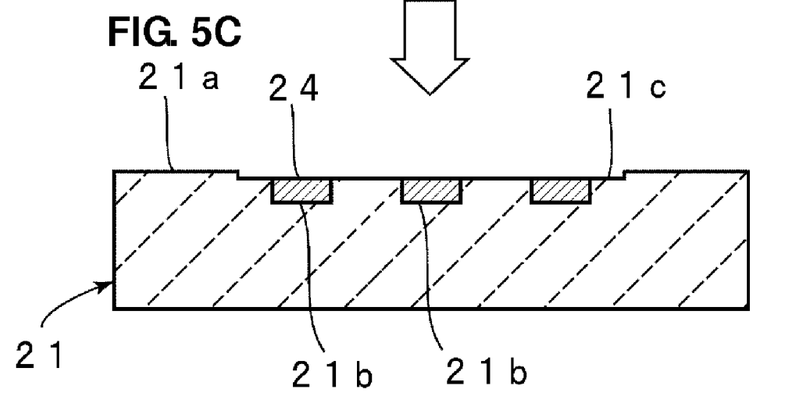

Next, as shown in FIG. 5B, another mask 25 is disposed on the top surface 21a of the piezoelectric substrate 21. The mask 25 includes an opening in which the metallic film 23 defining the IDT electrodes is formed. When the mask 25 is disposed, one portion of the top surface 21a of the piezoelectric substrate 21 and the upper portion of the metallic film 23 defining the IDT electrodes are removed using the dry etching method to form a recessed portion 21c. Thereafter, the mask 25 is removed by a solvent. In this manner, as shown in FIG. 5C, the piezoelectric substrate 21 that includes the recessed portion 21c in the top surface 21a can be obtained. In the recessed portion 21c, IDT electrodes 24 are disposed.

FIGS. 4A to 5C schematically show the method for manufacturing a portion in which the IDT electrodes 24 are to be formed. However, a portion in which the wiring electrodes are to be formed is also simultaneously formed in the same manner. After the recessed portion 21c is formed as shown in FIG. 5C, through-hole electrodes and terminal electrodes are formed as in forgoing preferred embodiment, and then a cover member is bonded. In this manner, a surface acoustic wave filter device is produced.

Figure 6:
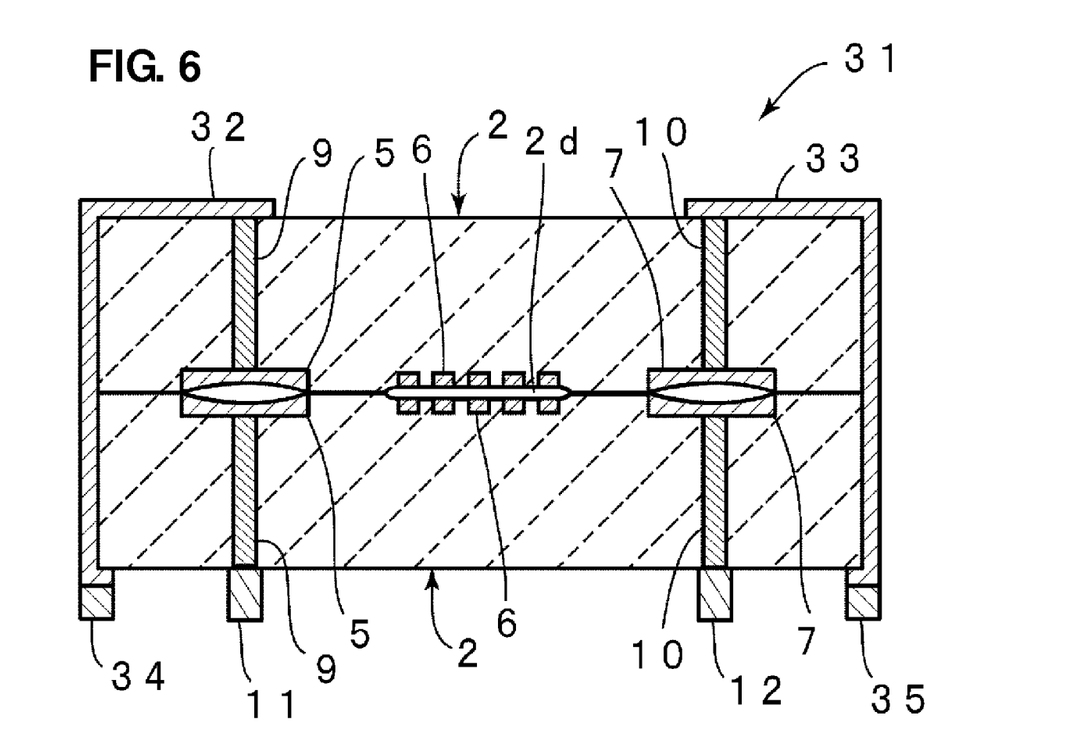
FIG. 6 is a front sectional view of a surface acoustic wave filter device according to another preferred embodiment of the present invention.

FIG. 6 is a front sectional view of a surface acoustic wave filter device according to another preferred embodiment of the present invention. In the surface acoustic wave filter device 1 shown in FIG. 1, the cover member 13 is bonded to the top surface 2a of the piezoelectric substrate 2. However, in a surface acoustic wave filter device 31 shown in FIG. 6, another upside-down piezoelectric substrate 2 is stacked on the top surface of the piezoelectric substrate 2, and bonded by direct bonding. In other words, instead of using the cover member 13 according to the first preferred embodiment, another piezoelectric substrate 2 having a configuration similar to that of the piezoelectric substrate 2 is used. The principal planes of the pair of the piezoelectric substrates 2 and 2 in which the IDT electrodes 6 are formed are stacked together, and the pair of the piezoelectric substrates 2 and 2 are bonded together by the direct bonding.

Accordingly, in this preferred embodiment, a stacked-type surface acoustic wave filter device 31 is formed, in which two surface acoustic wave filter elements are stacked.

On the top surface of the upper piezoelectric substrate 2, terminal electrodes 32 and 33 that are connected to the through-hole electrodes 9 and 10, respectively, are formed. The terminal electrodes 32 and 33 extend to the bottom surface of the lower piezoelectric substrate via the side surfaces of the stacked-type device in which the piezoelectric substrates 2 and 2 are stacked. On the bottom surface of the lower piezoelectric substrate 2, terminal electrodes 34 and 35 that are connected to terminal electrodes 32 and 33, respectively, are formed. Accordingly, the surface acoustic wave filter device 31 can be surface-mounted on a circuit board using the terminal electrodes 34 and 35 and the terminal electrodes 11 and 12.

In the present invention, the cover member does not necessarily function as a casing material. The cover member may function as an electronic component element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a surface acoustic wave device comprising the steps of:
   preparing a piezoelectric substrate and a cover member;
   forming, in one principal surface side of the piezoelectric substrate, grooves in portions in which an IDT electrode and a wiring electrode are to be provided;
   forming, on the one principal surface side of the piezoelectric substrate, a metallic film at least in the grooves;
   forming a recessed portion by removing one portion of the piezoelectric substrate from the one principal surface side of the piezoelectric substrate to form, using the metallic film positioned in the grooves, the IDT electrode and the wiring electrode; and
   bonding the cover member to the one principal surface side of the piezoelectric substrate.

2. The method for manufacturing a surface acoustic wave device according to claim 1, wherein the step of forming the recessed portion is performed by a CMP process from the one principal surface side of the piezoelectric substrate.

3. The method for manufacturing a surface acoustic wave device according to claim 1, wherein the step of forming the recessed portion is performed by dry etching while a mask is applied to the one principal surface side of the piezoelectric substrate.

4. The method for manufacturing a surface acoustic wave device according to claim 1, wherein the step of bonding the cover member to the piezoelectric substrate is performed by direct bonding.

5. The method for manufacturing a surface acoustic wave device according to claim 4, wherein, when the piezoelectric substrate and the cover member are to be directly bonded together, a hydrophilic insulating thin film is formed on the one principal surface side of the piezoelectric substrate or on a surface of the cover member that is to be bonded to the piezoelectric substrate.

6. The method for manufacturing a surface acoustic wave device according to claim 1, further comprising a step of forming, in the piezoelectric substrate, a through-hole electrode that is to be connected to the wiring electrode.

7. The method for manufacturing a surface acoustic wave device according to claim 1, further comprising a step of forming, in the cover member, a through-hole electrode that is to be electrically connected to the wiring electrode.

8. The method for manufacturing a surface acoustic wave device according to claim 1, wherein the cover member includes a piezoelectric substrate in one principal surface side of which an IDT electrode and a wiring electrode are formed.

\* \* \* \* \*